US010381466B1

(12) United States Patent
Khizroev et al.

(10) Patent No.: US 10,381,466 B1
(45) Date of Patent: Aug. 13, 2019

(54) NANOPARTICLE BASED COMPUTING ARCHITECTURE

(71) Applicants: Sakhrat Khizroev, Miami, FL (US); Rakesh Guduru, Miami, FL (US)

(72) Inventors: Sakhrat Khizroev, Miami, FL (US); Rakesh Guduru, Miami, FL (US)

(73) Assignee: The Florida International University Board of Trustees, Miami, FL (US)

( * ) Notice: Subject to any disclaimer, the term of this patent is extended or adjusted under 35 U.S.C. 154(b) by 0 days.

(21) Appl. No.: 16/158,596

(22) Filed: Oct. 12, 2018

(51) Int. Cl.
  *H01L 29/66* (2006.01)
  *H01L 43/02* (2006.01)
  *H01L 43/08* (2006.01)

(52) U.S. Cl.
  CPC ........ *H01L 29/66984* (2013.01); *H01L 43/02* (2013.01); *H01L 43/08* (2013.01)

(58) Field of Classification Search
  CPC .... H01L 29/66984; H01L 43/02; H01L 43/08
  See application file for complete search history.

(56) References Cited

U.S. PATENT DOCUMENTS

| 6,730,395 B2* | 5/2004 | Covington | B82Y 10/00 257/E21.665 |
| 2006/0192237 A1* | 8/2006 | Huai | B82Y 25/00 257/296 |
| 2008/0043519 A1* | 2/2008 | Kitagawa | G11C 11/1659 365/158 |
| 2016/0005956 A1* | 1/2016 | Tang | H01L 43/08 257/421 |

* cited by examiner

*Primary Examiner* — Peniel M Gumedzoe
(74) *Attorney, Agent, or Firm* — Saliwanchik, Lloyd & Eisenschenk

(57) ABSTRACT

A spintronic device can include a bottom contact layer, a bottom magnetic layer disposed on the bottom contact layer, a nanoparticle layer disposed on the bottom magnetic layer, a top magnetic layer disposed on the nanoparticle layer, and a top contact layer disposed on the top magnetic layer. The spintronic device can include a bottom insulation layer disposed between the bottom magnetic layer and the nanoparticle layer, and a top insulation layer disposed between the nanoparticle layer and the top magnetic layer.

17 Claims, 6 Drawing Sheets

NANOPARTICLE BASED COMPUTING ARCHITECTURE

STATEMENT OF GOVERNMENT SUPPORT

This invention was made with government support under Grant No. ECCS0939514 awarded by the National Science Foundation. The government has certain rights in the invention.

BACKGROUND

There is no doubt that the future will be overwhelmed with exciting information processing technologies and applications driven not only by the internet but also by many new emerging concepts such as the Internet of Things (IoT), Internet of Human Body, wireless and wired sensor networks, and many others. However, to drive all these technologies at their full capacity, it is imperative to create a new hardware technology. It is recognized that current complementary metal-oxide-semiconductor (CMOS) devices have run out of steam and that Moore's Law cannot continue with CMOS alone. The next-generation energy-efficient information processing applications will require unprecedented high data rates, data storage densities, and energy efficiency that cannot be matched by the existing CMOS based hardware. Quantum computing—the holy grail of computation—will likely be required at some point and will likely prevail in the information industry. However, achieving the capabilities of this new computing paradigm today is still out of the question because of the fundamental challenges associated with enabling quantum input and output. Some hybrid technologies should emerge as a stepping stone towards achieving quantum computing.

Indeed, spintronic/nanomagnetic nanotechnologies are widely considered as a promising alternative to current semiconductor microprocessor and memory technologies, which today are facing fundamental limitations in scaling and power consumption. Spintronic nanodevices have advantages of non-volatility in both logic and memory, an ultra-low power consumption, radiation hardness, scalability to the sub-5-nm size range, and a capability for multilevel three-dimensional (3D) integration with a significantly improved thermal management. Despite all these advantages, spintronic devices have been used only for a few relatively small niche applications. The reason for the current inadequate market penetrability of spintronics is the relatively low "On/Off" ratio of spintronic devices compared to existing CMOS technologies. In spintronic devices, it is the giant magnetoresistance (GMR) that defines the "On/Off" ratio. Considering the GMR value in state-of-the-art demonstrations is on the order of 100% (equivalent to an "On/Off" ratio of 1), it is still at least three orders of magnitude smaller than typical values in CMOS technologies. One of the main challenges to create such small devices is the fabrication limitation. Even with state-of-the-art nanofabrication approaches such as electron beam lithography (EBL), focused ion beam (FIB) etching and deposition, and imprint lithography, it is difficult to fabricate high quality spintronic devices in this size range.

BRIEF SUMMARY

Embodiments of the subject invention provide novel and advantageous spintronic devices that comprise a dual magnetic junction layer disposed between a bottom contact layer and a top contact layer, thereby reducing a size while activating the desired quantum physics effects.

In an embodiment, a spintronic device can comprise: a bottom contact layer; a top contact layer disposed on the bottom contact layer; and a dual magnetic junction layer disposed between the bottom contact layer and the top contact layer.

In another embodiment, a spintronic device can comprise: a bottom contact layer; a bottom magnetic layer disposed on the bottom contact layer; a nanoparticle layer disposed on the bottom magnetic layer; a top magnetic layer disposed on the nanoparticle layer; and a top contact layer disposed on the top magnetic layer.

In yet another embodiment, a spintronic device can comprise: a bottom contact layer; a bottom magnetic layer disposed on the bottom contact layer; a bottom insulation layer disposed on the bottom magnetic layer; a plurality of magnetic nanoparticles disposed on the bottom insulation layer; a top insulation layer disposed on the plurality of magnetic nanoparticles; a top magnetic layer disposed on the top insulation layer; and a top contact layer disposed on the top magnetic layer, a bottom magnetization direction of the bottom magnetic layer and a top magnetization direction of the top magnetic layer being anti-parallel to each other, and each of the bottom magnetic layer and the top magnetic layer being a CoFeB-based ferromagnetic layer, each of the plurality of magnetic nanoparticles being a $CoFe_2O_4$-based ferromagnetic nanoparticle and a size of each magnetic nanoparticle being equal to or less than 2 nm, and each of magnetic nanoparticles being spaced apart from the bottom magnetic layer and the top magnetic layer by the bottom insulation layer and the top insulation layer, respectively.

DETAILED DESCRIPTION

Embodiments of the subject invention provide novel and advantageous spintronic devices that comprise a dual magnetic junction layer disposed between a bottom contact layer and a top contact layer, thereby reducing a size while activating the desired quantum physics effects.

Spintronic devices are one of the most promising hardware technologies for next-generation energy-efficient information processing applications. Arguably, spintronics-based hardware could drive multi-trillion-dollar information related industries associated with the internet, a myriad of mobile devices, emerging internet of things (IoT), wireless sensors, and many others. Using a nanoparticle-based computing architecture, embodiments of the subject invention address the problem of the relatively low "On/Off" ratio of existing spintronic devices—the stumbling block that has severely impeded wide implementation of spintronics technologies to date. Embodiments of the subject invention take advantage of quantum physics to perform computing operations although classical input and output are still used. Particularly, embodiments rely on exploiting spintronic/nanomagnetic devices to achieve the desired properties for enabling next-generation information processing.

To address the aforementioned stumbling block, embodiments exploit a new physical mechanism to substantially increase the "On/Off" ratio in spintronic devices. Particularly, embodiments take advantage of the quantum-mechanical physics that start to prevail in the sub-3-nm size range. As the size is reduced into this range, due the smaller size and more discrete electron energy spectra, the increased surface-to-volume ratio and the deviation from the traditional continuous crystalline lattice model, the thermal reservoir, which absorbs the magnetic excitation energy, becomes so small that it is unable to absorb all the energy and thus the excitation's lifespan significantly increases. This in turn, due to dramatically increased spin accumulation effects, could lead to anomalous magnetoresistance effects.

Figure 1:
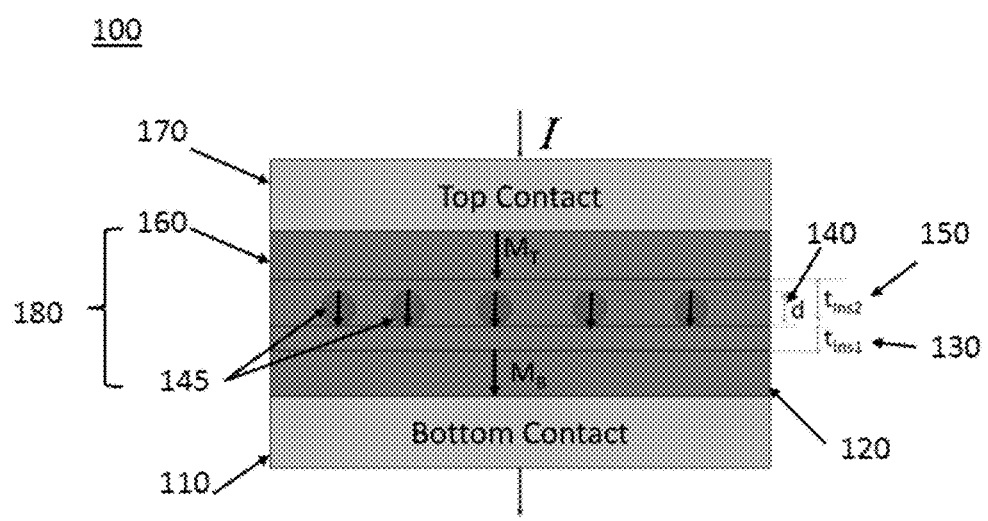
FIG. 1 shows a spintronic device according to an embodiment of the subject invention.

FIG. 1 shows a spintronic device according to an embodiment of the subject invention. Referring to FIG. 1, in an embodiment, a spintronic device 100 comprises a bottom contact layer 110, a top contact layer 170 disposed on the bottom contact layer 110, and a dual magnetic junction layer 180 disposed between the bottom contact layer 100 and the top contact layer 170. The dual magnetic junction layer 180 comprises a bottom magnetic layer 120 disposed on the bottom contact layer 110, a bottom insulation layer 130 disposed on the bottom magnetic layer 120, a nanoparticle layer 140 disposed on the bottom insulation layer 130, a top insulation layer 150 disposed on the nanoparticle layer 140, and a top magnetic layer 160 disposed on the top insulation layer 150. That is, the bottom contact layer 110, the bottom magnetic layer 120, the bottom insulation layer 130, the nanoparticle layer 140, the top insulation layer 150, the top magnetic layer 160, and the top contact layer 170 are stacked consecutively.

The nanoparticle layer 140 comprises a plurality of magnetic nanoparticles 145. Each of the plurality of magnetic nanoparticles 145 is disposed on the bottom insulation layer 130, and the top insulation layer 150 is disposed on each of the plurality of magnetic nanoparticles 145. A top thickness $T_{Ins2}$ of the top insulation layer 150 is the same as or larger than a bottom thickness $T_{Ins1}$ of the bottom insulation layer 130. When the top thickness $T_{Ins2}$ is larger than a size d of the magnetic nanoparticle 145, the top insulation layer 150 may cover each of the plurality of magnetic nanoparticles 145. Therefore, the plurality of magnetic nanoparticles 145 are sandwiched in two magnetic tunneling junctions that includes a top magnetic tunneling junction made of the top magnetic layer 160, the top insulation layer 150, and the nanoparticle layer 140, and a bottom magnetic tunneling junction made of the bottom magnetic layer 120, the bottom insulation layer 130, and the nanoparticle layer 140.

In view of the above, to enable a quantum-mechanically driven high "On/Off" ratio in next-generation spintronic/nanomagnetic devcies, embodiments of the subject invention use magnetic nanoparticles embedded into a magnetic tunneling junction (MTJ), as schematically illustrated in FIG. 1. It is noteworthy that it is straightforward to synthesize nanoparticles as small as 2 nm or smaller (instead of using the above nanofabrication approaches) to build spintronic/nanomagnetic devices with a characteristic planar feature in the size range necessary for activating the desired quantum physics effects.

The magnetic nanoparticles 145 can be made of, for example, a ferromagnetic, ferrimagnetic, or antiferromagnetic material. When the magnetic nanoparticles 145 are that small, they become more quantum-mechanical and their energy spectra become more discrete, unlike continuous spectra in relatively large structures. In addition, such small magnetic nanoparticles 145 may also start to display half-metallic properties, characterized by different spectra for majority ("+") and minority ("−") spin electrons, as illustrated in FIG. 2.

Figure 2:
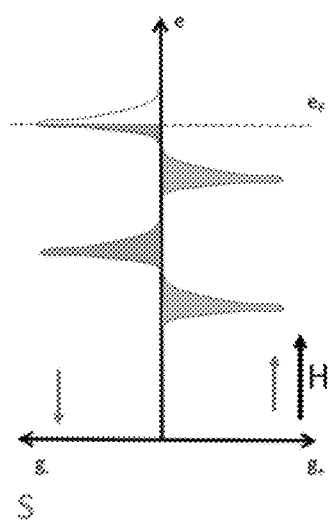
FIG. 2 shows discrete and half-metallic energy spectra of the magnetic nanoparticles in a spintronic device according to an embodiment of the subject invention.

FIG. 2 shows discrete and half-metallic energy spectra of the magnetic nanoparticles in a spintronic device according to an embodiment of the subject invention. In particular, the magnetic nanoparticles have a size less than 3 nm or preferable 2 nm.

Referring to FIGS. 1 and 2, when considering relatively small coercivity values of the three magnetic components of the nanoparticle-embedded MTJ structure including the two magnetic layers 120 and 160, and the nanoparticle layer 140, respectively, the resistance of this spintronic device 100 is sensitive to an external magnetic field. As a magnetic field is applied, the two magnetizations $M_B$ and $M_T$ in the two magnetic layers 120 and 160, respectively, become oriented in the same direction. In this case, because the minority electrons would be barely present in the two magnetic layers 120 and 160, only the majority electrons could tunnel through the junction. If the external magnetic field is changed, the number of states at each energy level within the nanoparticle changes and thus the Fermi energy $e_F$ effectively moves over the discrete energy levels. Only when the Fermi level $e_F$ is aligned with a majority spectrum band, the spin polarized electrons could conduct through the junction. Therefore, one could expect an oscillating MR effect with a relatively high "On/Off" ratio. According to this trivial representation, we could easily evaluate the expected value of the "On/Off" ratio of such a device:

$$\text{“On/Off” Ratio} = R_{on}/R_{off} \sim e^{-t_{ins}/a} e^{-2t_{ins}/a} \sim e^{t_{ins}/a},$$

where a and $t_{ins}$ are the tunneling constant and the insulating thickness, respectively. Assuming the tunneling constant is on the order of 0.2 nm and the insulating thickness is on the order of 1 nm, an "On/Off" ratio on the order of 100 or higher could be expected. This estimate is approximate and could even be quite conservative. The tunneling constant strongly depends on the crystal structures of the insulating layer and adjacent magnetic layers. In addition, the ratio could be further increased by increasing the thickness of the insulating layer.

To overcome challenges of top-down fabrication approaches of the related art, magnetic nanoparticles can be used to define the key device features in embodiments of the subject invention. A layer of high-anisotropy 2-nm $CoFe_2O_4$ nanoparticles can be sandwiched as the central nanoparticle layer into the standard spin-transfer torque magnetic tunneling junction (STT-MTJ) stack. With further focused ion beam (FIB) trimming, a dual-layer junction including one of more nanoparticles separating two CoFeB ferromagnetic layers can be turned into a two-terminal spintronic transistor. The measured room-temperature electron transport through the device shows a Coulomb staircase effect characteristic of a single electron transport, which also depended on relative magnetic states of the ferromagnetic layers and the nanoparticle. Besides having the staircase steps, the V-I curve indicates switching of the nanoparticle's magnetization through the STT effect at currents of above 0.05 uA. The magnetoresistance (MR) curve of this device has anomalous oscillatory field dependence in a relatively low field range of below 100 Oe.

Spintronic nanotechnologies are widely considered to be a promising alternative to the semiconductor microprocessor and memory technologies, which are currently facing fundamental limitations in scaling and power consumption. Spintronic nanodevices have advantages of non-volatility in both logic and memory, ultra-low power consumption, radiation hardness, scalability into the sub-5-nm size range, and capability of multilevel three-dimensional (3D) integration with significantly improved thermal management. However, despite all these advantages, these devices have been used only in relatively narrow niche applications. Many promising theoretical predictions have never been realized experimentally because of the difficulty to build and test such small devices. Further, for the same reason, the physics in this size range and the resulting device capabilities have not been well understood and exploited. As the characteristic size is reduced below approximately 2 nm, the device properties become driven by the laws of quantum mechanics. In addition, due to the combined effect of the significantly increased surface-to-volume ratio and the deviation from the traditional continuous crystalline lattice model, the thermal reservoir, which absorbs the magnetic excitation energy, becomes too inefficient to be able to absorb all the energy. As a result, the spin excitation's lifespan significantly increases, which in turn due to the resulting dramatically increased spin accumulation and other quantum-mechanical effects, could lead to anomalous magnetotransport effects even at room temperature. Understanding the underlying physics in this size range is crucial for discovering and building next-generation spintronic devices.

Hence, a main objective of embodiments of the subject invention is to build spin-transfer torque (STT) dual magnetic tunneling junction (MTJ) devices with key elements having sizes on the order of 2 nm and then test their magnetotransport characteristics at room temperature. Because of the difficulty to build such small devices using traditional top-down approaches such as UV-optics, electron-beam lithography (EBL), focused ion beam (FIB) etching, imprint lithography, and others, the key features are defined by using ultra small magnetic nanoparticles embedded into magnetic junctions. Using nanoparticles presents a viable alternative fabrication approach not only for understanding the spin physics in this size range but also for mass production of future nanoelectronic/spintronic devices because of the existence of many well-established chemical processes to provide sub-5-nm nanoparticles with a very broad range of desired properties with an adequately high uniformity in size and composition.

Figure 3:
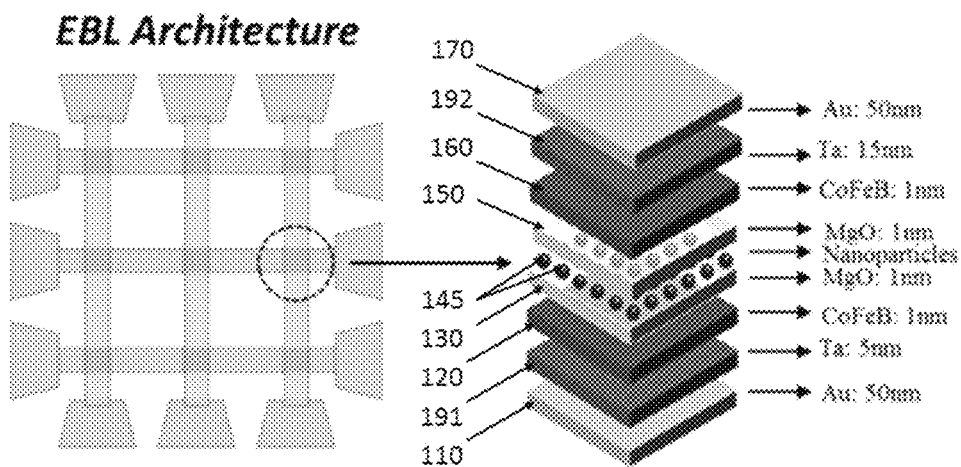
FIG. 3 shows an EBL architecture and a unit cell of a spintronic device according to an embodiment of the subject invention.

FIG. 3 shows an EBL architecture and a unit cell of a spintronic device according to an embodiment of the subject invention. Referring to FIG. 3, the magnetic nanoparticles 145 as the key elements are made of 2-nm $CoFe_2O_4$-based ferrimagnetic nanoparticles. The nanoparticle layer 140 of the magnetic nanoparticles 145 is sandwiched between two 1-nm thick MgO layers of the bottom 130 and top 150 insulation layers separating them from two adjacent 1-nm thick CoFeB-based ferromagnetic layers of the bottom 120 and top 160 magnetic layers. The two ferromagnetic layers of the bottom 120 and top 160 magnetic layers are covered by a bottom Ta layer 191 and a top Ta layer 192 which in turn are covered by gold contact layers of the bottom 110 and top 170 contact layers.

Figure 4:
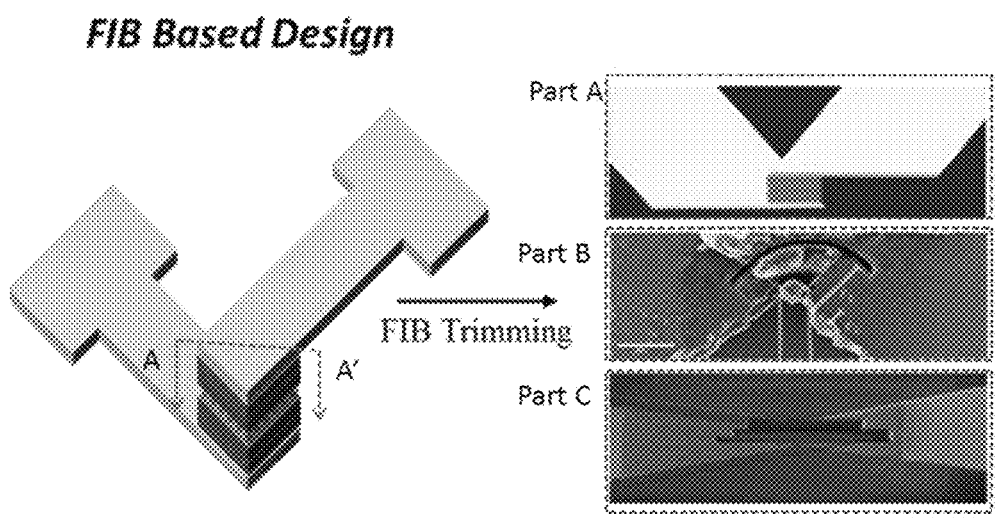
FIG. 4 shows a cross-sectional view and scanning electron microscopy (SEM) images with focused ion beam (FIB) trimming of a spintronic device according to an embodiment of the subject invention.

FIG. 4 shows a cross-sectional view and scanning electron microscopy (SEM) images with focused ion beam (FIB) trimming of a spintronic device according to an embodiment of the subject invention. Part A of FIG. 4 shows a cross-sectional view taken along line A-A' of the spintronic device, and Part B and Part C show top views of the junction after FIB trimming. In particular, Part B shows a zoomed in top view and Prat C shows a zoomed out top view. Referring to FIG. 4, the final planar sizes of the embodiments are defined through focused ion beam (FIB) trimming. The r1 and r2 show parameters of FIB cuts to ensure the planar sizes of the junction after trimming. The r2 defines the characteristic planar size of the junction, and the r1 defines the diameter of the cut required to electrically separate the effective junction from the bulk material.

Figure 5A:
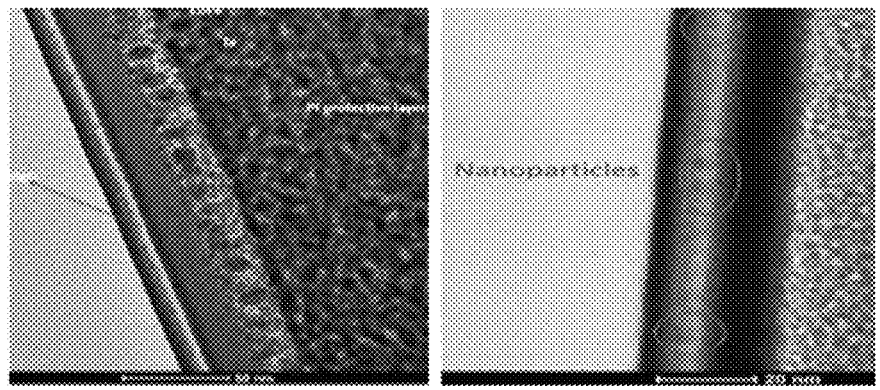
FIG. 5(a) shows a high-resolution transmission electron microscopy (TEM) image of a spintronic device according to an embodiment of the subject invention.

FIG. 5(a) shows a high-resolution transmission electron microscopy (TEM) image of a spintronic device according to an embodiment of the subject invention. Referring to FIG. 5(a), the spintronic device comprises Pt as the top contact layer and further comprises a protective layer on the top contact layer of the Pt as a passivation layer.

Figure 5B:
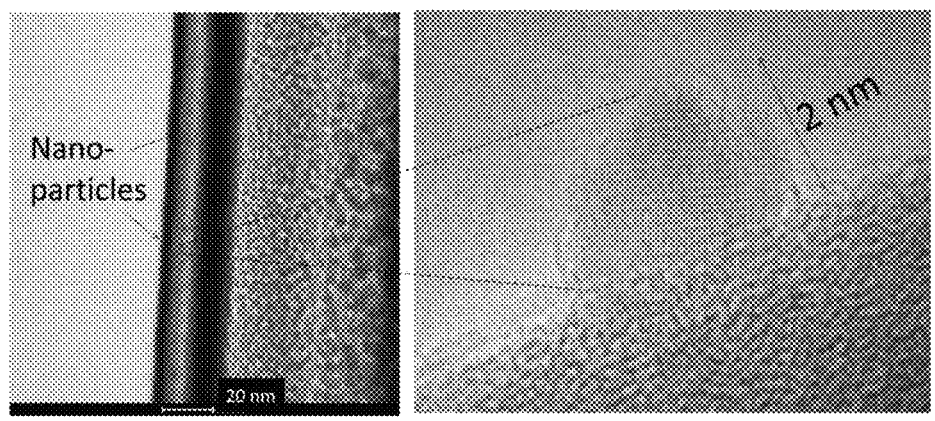
FIG. 5(b) shows an enlarged TEM image of a spintronic device according to an embodiment of the subject invention.

FIG. 5(b) shows an enlarged TEM image of a spintronic device according to an embodiment of the subject invention. Referring to FIGS. 5(a) and 5(b), the magnetic nanoparticles are located in the MgO layers and have a size of 2 nm.

Figure 5C:
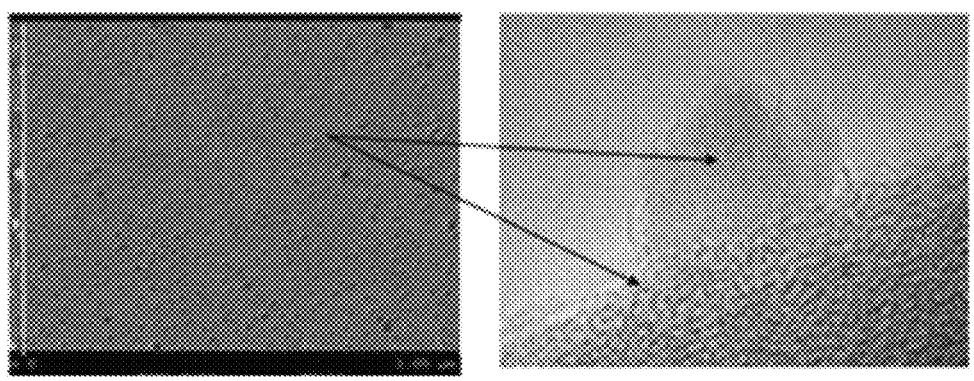
FIG. 5(c) shows an atomic force microscope (AFM) image and TEM image of a spintronic device according to an embodiment of the subject invention.

FIG. 5(c) shows an atomic force microscope (AFM) image and TEM image of a spintronic device according to an embodiment of the subject invention. The AFM image of FIG. 5(c) shows a planar view of partially deposited layers and shows a roughness of a surface due to the magnetic nanoparticles of 2 nm.

Figure 6A:
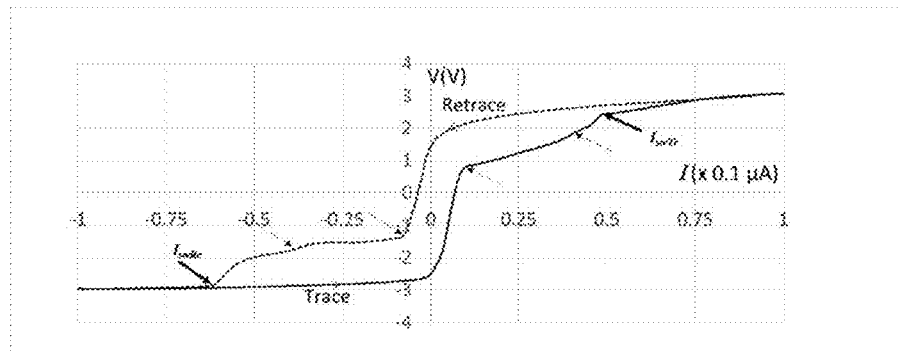
FIG. 6(a) shows V-I curve for trace and retrace current directions of a spintronic device according to an embodiment of the subject invention.

FIG. 6(a) shows V-I curve for trace and retrace current directions of a spintronic device according to an embodiment of the subject invention. All the transport measurements are conducted at room temperature. Referring to FIG. 6(a), the curve is measured in the both current sweep directions, with the current increased from a negative value to a positive value and then decreased back to the negative value, defined as trace and retrace directions, respectively. It can be noted that for one current polarity in each sweep direction, the V-I curve displays a characteristic Coulomb Blockade (CB) type of dependence, with the signature Coulomb staircase. The characteristic Coulomb staircase steps are shown by thin arrows. The STT switching currents are shown by thick arrows. The STT switching currents in the two current sweep orientations are marked as the $I_{swTr}$ and $I_{swRe}$ values, respectively.

Figure 6B:
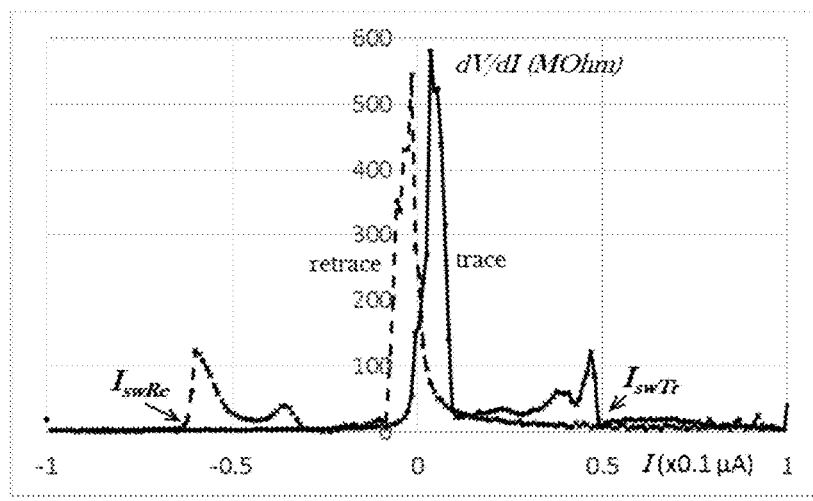
FIG. 6(b) shows dV/dI-I curves for trace and retrace current directions of a spintronic device according to an embodiment of the subject invention.

FIG. 6(b) shows dV/dI-I curves for trace and retrace current directions of a spintronic device according to an embodiment of the subject invention. Referring to FIG. 6(b), based on the V-I curve, the current dependence of the differential resistance, dV/dI-I, for the both current sweep directions, trace and retrace, respectively, are shown.

Figure 6C:
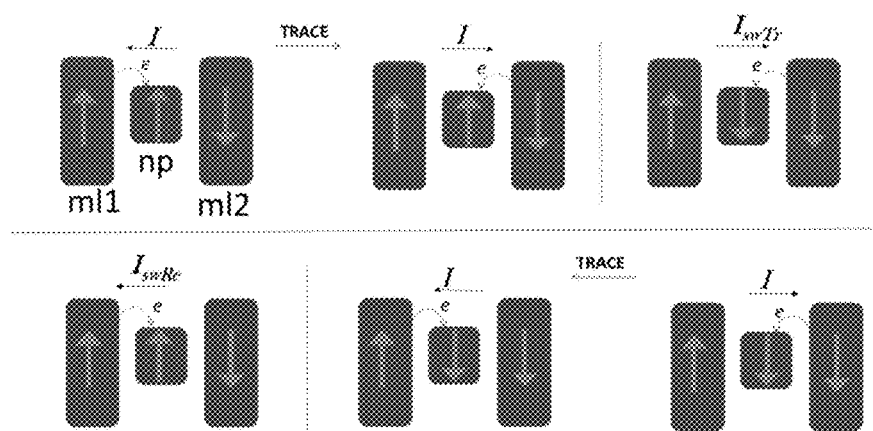
FIG. 6(c) shows relative magnetization orientations of the two magnetic layers and the nanoparticle at different chronological points during the trace and retrace current sweep directions.

FIG. 6(c) shows relative magnetization orientations of the two magnetic layers and the nanoparticle at different chronological points during the trace and retrace current sweep directions. FIG. 6(c) shows the nanoparticle magnetization switching corresponding to different points on the V-I curve in a chronological order when the current increases from a negative value to a positive value (trace) and then goes back to the negative value (retrace). The magnetization directions of the magnetic layers always remains the same direction (anti-parallel with respect to each other), while the nanoparticle magnetization is switched by the STT effect. Because of the dominant shape anisotropy, the magnetization directions in the two magnetic layers are oriented in the plane of the junction. The relative orientations of the two layers could be forced into an anti-parallel state by an a.c. demagnetization through application of a decaying a.c. field at a frequency of 60 Hz. To ensure the system (of the two magnetic layers) remains in the anti-parallel state, an applied magnetic field shouldn't exceed the magnetic coupling field on the order of 300 Oe. In this low-field range, below approximately 100 Oe, it is only the nanoparticle's magnetization which can reverse.

Figure 7A:
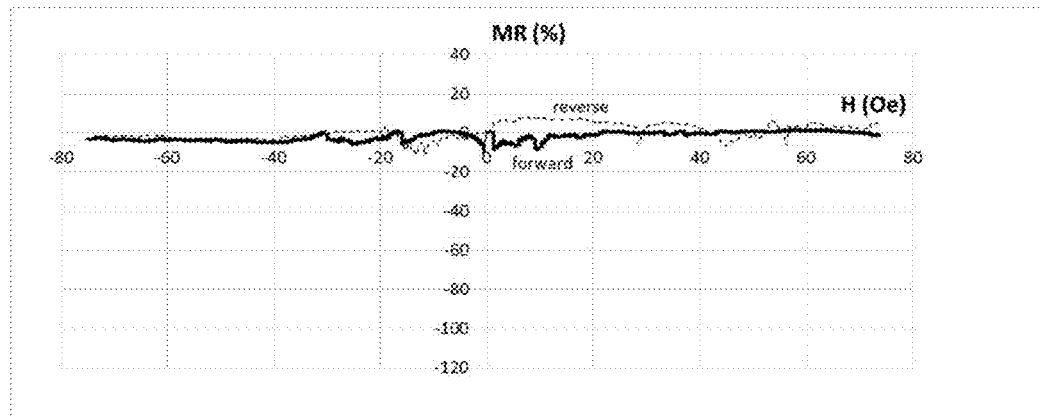
FIG. 7(a) shows a full-loop low-field magnetoresistance (MR) dependence of a spintronic device according to an embodiment of the subject invention with a magnetic field applied perpendicular to the film plane for a current value of 0.01 uA.
Figure 7B:
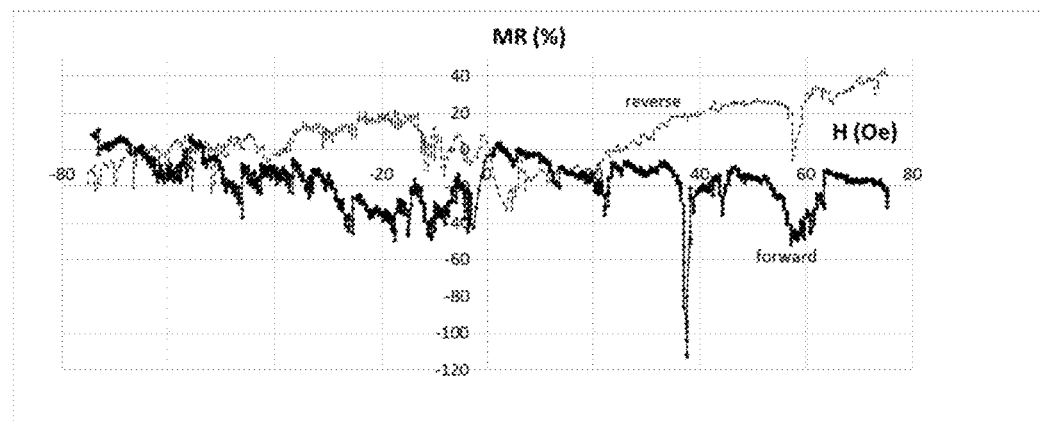
FIG. 7(b) shows a full-loop low-field magnetoresistance (MR) dependence of a spintronic device according to an embodiment of the subject invention with a magnetic field applied perpendicular to the film plane for a current value of 0.05 uA

FIG. 7(a) shows a full-loop low-field magnetoresistance (MR) dependence of a spintronic device according to an embodiment of the subject invention with a magnetic field applied perpendicular to the film plane for a current value of 0.01 uA. FIG. 7(b) shows a full-loop low-field magnetoresistance (MR) dependence of a spintronic device according to an embodiment of the subject invention with a magnetic field applied perpendicular to the film plane for a current value of 0.05 uA. Referring to FIGS. 7(a) and 7(b), each loop is taken for a field decreased from 80 to −80 Oe (forward sweep) and then increased from −80 to +80 Oe (reverse sweep). For the current value of 0.05 uA, relatively reversible MR oscillations, with a characteristic field separation between adjacent resistance slumps on the order of 20 Oe, can be observed. In contrast, no significant reversible dependence can be seen for the current value of 0.01 uA. The data were taken with a characteristic measurement time constant of 1 msec. It is noteworthy that no oscillations could be detected for an applied magnetic field higher than approximately 100 Oe.

By adding a new central nanoparticle layer of magnetic nanoparticles into the traditional STT-MTJ multilayer stack, each device can be turned into an array of dual junctions capable of single-electron transport. Further FIB trimming assured only one or few magnetic nanoparticles are involved in the final device characteristics. Indeed, the steps in the above V-I curve of FIG. 6(a) are reminiscent of the standard (non-magnetic) Coulomb staircase characteristic of the single-electron transport through a dual junction. However, unlike the symmetric staircase in the traditional non-magnetic CB case, this staircase can be observed only in one half of the V-I curve for each current sweep direction. Indeed, the staircase is observed for the positive or negative current polarity only, depending on the current being swept in the trace or retrace direction, respectively. This difference from the traditional case could be explained by the magnetic nature of this Coulomb blockade because of the presence of the two ferromagnetic layers. The suggested change of the relative nanoparticle's magnetization direction with respect to the magnetization directions of the two magnetic layers throughout different points on the V-I curve is illustrated in FIG. 6(c).

To minimize the magnetic energy, the magnetization directions in the two CoFeB layers can have anti-parallel in-plane orientations. The in-plane magnetic anisotropy is dominated by shape in this case. While the directions of the ferromagnetic layers remain unchanged, the magnetization of the nanoparticle can be oriented along either of these two anti-parallel orientations and can be switched between them through the STT effect. The interaction between each incoming electron and the electron already sitting on the nanoparticle is affected by the relative orientation of the magnetization of the magnetic layer (giving away the electron) and the nanoparticle magnetization. Due to the spin-dependent exchange coupling, the Coulomb repulsion for the parallel and antiparallel spin orientations would be effectively further increased and decreased, respectively. Therefore, in the parallel case, it would take a higher voltage to push the sitting electron away from the nanoparticle and towards the other magnetic layer (receiving the electron), compared to the antiparallel case. In other words, the CB would be stronger and thus it would be easier to observe the characteristic staircase dependence for the parallel spin orientation. Eventually, when the electric current is further increased, it results in reversing the nanoparticle's magnetization due to the STT effect. When the current sweep orientation is reversed (retrace), the physics of the spin interaction repeats now for the other current polarity.

Referring to FIGS. 7(a) and 7(b), at the high current value, 0.05 uA, a relatively reversible oscillatory dependence is observed, while no significant reversible dependence is seen at the low current value, 0.01 uA. These two current values correspond to very different regions in the Coulomb staircase on the V-I curve of FIG. 6(a). One explanation of the observed oscillations could be due to the fact that the magnetic field effectively shifts the Fermi energy through the nanoparticle's discrete energy levels, similar to the process driven by an electric field in the traditional CB staircase. The first step on the V-I staircase occurs at a value of 0.01 uA (FIG. 6(a)). Because the high current value, 0.05 uA, is above the first step, application of the perpendicular magnetic field effectively shifts steps through the value resulting in the resistance slumps. In contrast, because the small current value, 0.01 uA, is already below or close to the first step, application of the field barely affects the dependence. The fact that no oscillations could be detected for a relatively high field, >100, required for breaking the relative magnetic alignment between the two magnetic layers, indicates the importance of the magnetic states of the two ferromagnetic layers. It is noteworthy that in this experiment the magnetic field is applied perpendicular to the orientation of the magnetization in the magnetic layers. This magnetic field is intentionally kept adequately small to avoid any significant disturbance of the anti-parallel in-plane magnetization directions in these layers. Nevertheless, this small perpendicular field is sufficient to cause the observed MR oscillations.

The measured room-temperature electron transport through the described nanoparticle-integrated dual STT-MTJ shows a characteristic single-electron type of dependence, which in addition strongly depends on an applied magnetic field. The observed oscillatory dependence of MR could be explained by the magnetic field dependence of the Coulomb effect for a dual junction device with ferromagnetic layers. It is noteworthy that the magnetic-field dependent characteristic makes this design suitable for two-terminal field-gated transistors for next-generation spintronic applications. In this case, the two magnetic layers of the dual junction act as source and drain terminals, respectively, while the magnetic state of the nanoparticle serves as a gate. The magnetic state of the gate is controlled by a spin-polarized current via the STT effect.

Referring to FIGS. 1-4, in an embodiment, the spintronic device 100 can be manufactured as follows.

The bottom layer can be patterned through optical lithography followed by lift-off. Then, electron beam evaporation can be used to deposit 15 nm of Cr as an adhesion layer, followed by 135 nm of Au. After a small area (~5 um) can be patterned with optical lithography, the junction layers can be deposited through sputtering with nanoparticles sandwiches between the two magnetic layers according to the following composition: Ta (5 nm)/CoFeB (1 nm)/MgO (0.9 nm)/Nanoparticles/MgO (0.9 nm)/CoFeB (1 nm)/Ta (5 nm). The films can be deposited with 10 sccm of Ar at a process pressure of 2 mTorr. Samples can be rotated at 40 rpms to ensure uniformity. The roughness can be measured using atomic force microscopy (AFM) and the deposition rate recorded with profilometry. Ferrimagnetic $CoFe_2O_4$ 2 nm nanoparticles, synthesized with a chemical process (co-precipitation), can be deposited onto the first sputtered MgO layer. The nanoparticles can be suspended in a hexane solution and deposited with a dropper. The second MgO layer can be sputtered to isolate the nanoparticles from the top CoFeB film. Magnetic force microscopy (MFM) can be conducted to verify the magnetic nature of the particle, and the nanoparticles' crystallinity is verified through high-resolution TEM. This can also be a lift-off process. The photolithography can be carefully performed to ensure sufficient undercut to avoid coating the resist sidewall with the sputtered material and thus eliminate the undesired "rabbit ears". As an additional precaution, to avoid any electrical shorts from the poor lift-off, FIB is used to trim around the sidewalls of the device. To prevent the top contact from electrically shorting with the junction sides, a passivation layer can be patterned around the MTJ. Aluminum oxide or magnesium oxide can be sputtered for the sidewall passivation. Finally, the top contact can be patterned and lifted off where 15 nm of Cr can be deposited followed by 55 nm of Au. Sputtering can be used for the final contact rather than evaporation to ensure sidewall coverage across the passivation layer.

With respect to the magnetic nanoparticle synthesis, Cobalt Ferrite 2-nm nanoparticles can be synthesized using a co-precipitation process. The reactant solutions can be prepared by dissolving 0.1 mol of cobalt nitrate hexahydrate, $Co(NO_3)_2.6H_2O$, and 0.2 mol of iron chloride, $FeCl_2$, in 50 ml of deionized water. While being stirred, the solution can be heated to 37° C., followed by addition of 20 ml of sodium hydroxide solution (3.5 mol) with a single pour. The formation of $CoFe_2O_4$ particles can be signaled by emergence of black co-precipitates. While containing stirring for 30 mins, 1 ml oleic acid can be added to the solution drop by drop. After additional 2 hours of stirring at the above temperature, the suspensions can be let cool to room temperature naturally. The resulting black-color nanoparticles can be washed several times with deionized water, ethanol, and then centrifuged at 3500 rpm for 5 mins to remove impurities. Finally, the required black powder can be obtained through drying in a vacuum chamber.

For measuring magnetotransport, a Keithley 2450 sourcemeter in a 4-point electrical contact orientation can be used for V-I measurements. The Keithley can source a sweeping current from a minimum to a maximum current while measuring voltage and looping back and vice versa. For all magnetoresistance measurements, the Keithley sourcemeter can still be used for electrical resistance measurements, but while keeping the sourced current fixed. The Keithley in conjunction with Helmholtz Coils with no iron core can be used to sweep the applied magnetic field in the range under study. This allows for relatively fast sweeping of low magnetic fields of up to 200 Oe, with a characteristic time constant of 100 msec. The field can be applied perpendicular to the MTJ plane.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A spintronic device, comprising:
   a bottom contact layer;
   a top contact layer disposed on the bottom contact layer; and
   a dual magnetic junction layer disposed between the bottom contact layer and the top contact layer,
   the dual magnetic junction layer comprising a bottom magnetic layer disposed on the bottom contact layer, a bottom insulation layer disposed on the bottom magnetic layer, a nanoparticle layer disposed on the bottom insulation layer, a top insulation layer disposed on the nanoparticle layer, and a top magnetic layer disposed on the top insulation layer.

2. The spintronic device according to claim 1, the nanoparticle layer comprising a plurality of magnetic nanoparticles.

3. The spintronic device according to claim 2, the plurality of magnetic nanoparticles comprising at least one of a ferromagnetic material, a ferrimagnetic material, and an anti-ferromagnetic material.

4. The spintronic device according to claim 3, a size of each magnetic nanoparticle being less than 2 nm.

5. The spintronic device according to claim 1, a bottom magnetization direction of the bottom magnetic layer and a top magnetization direction of the top magnetic layer being anti-parallel to each other.

6. A spintronic device, comprising:
   a bottom contact layer;
   a bottom magnetic layer disposed on the bottom contact layer;
   a nanoparticle layer disposed on the bottom magnetic layer;
   a top magnetic layer disposed on the nanoparticle layer;
   a top contact layer disposed on the top magnetic layer;
   a bottom insulation layer disposed between the bottom magnetic layer and the nanoparticle layer; and
   a top insulation layer disposed between the nanoparticle layer and the top magnetic layer.

7. The spintronic device according to claim 6, the nanoparticle layer comprising a plurality of magnetic nanoparticles.

8. The spintronic device according to claim 7, the plurality of magnetic nanoparticles comprising at least one of a ferromagnetic material, a ferrimagnetic material, and an anti-ferromagnetic material.

9. The spintronic device according to claim 8, each of the plurality of magnetic nanoparticles comprises ferrimagnetic $CoFe_2O_4$.

10. The spintronic device according to claim 7, each of the bottom magnetic layer and the top magnetic layer comprising CoFeB.

11. The spintronic device according to claim 7, each of the bottom insulation layer and the top insulation layer comprising MgO.

12. The spintronic device according to claim 7, each of the bottom contact layer and the top contact layer comprising at least one of Au and Pt.

13. The spintronic device according to claim 7, further comprising a bottom Ta layer disposed between the bottom contact layer and the bottom magnetic layer, and a top Ta layer disposed between the top magnetic layer and the top contact layer.

14. The spintronic device according to claim 7, the top insulation layer filling a space between adjacent two magnetic nanoparticles.

15. The spintronic device according to claim 7, a size of each magnetic nanoparticle being equal to or less than 2 nm, and a thickness of each of the bottom insulation layer and the top insulation layer being equal to or less than 1 nm.

16. The spintronic device according to claim 7, a bottom magnetization direction of the bottom magnetic layer and a top magnetization direction of the top magnetic layer being anti-parallel to each other.

17. A spintronic device, comprising:
a bottom contact layer;
a bottom magnetic layer disposed on the bottom contact layer;
a bottom insulation layer disposed on the bottom magnetic layer;
a plurality of magnetic nanoparticles disposed on the bottom insulation layer;
a top insulation layer disposed on the plurality of magnetic nanoparticles;
a top magnetic layer disposed on the top insulation layer; and
a top contact layer disposed on the top magnetic layer,
a bottom magnetization direction of the bottom magnetic layer and a top magnetization direction of the top magnetic layer being anti-parallel to each other, and each of the bottom magnetic layer and the top magnetic layer being a CoFeB-based ferromagnetic layer,
each of the plurality of magnetic nanoparticles being a $CoFe_2O_4$-based ferromagnetic nanoparticle and a size of each magnetic nanoparticle being equal to or less than 2 nm, and
each of magnetic nanoparticles being spaced apart from the bottom magnetic layer and the top magnetic layer by the bottom insulation layer and the top insulation layer, respectively.

* * * * *